United States Patent
Yang et al.

(10) Patent No.: US 6,797,587 B1
(45) Date of Patent: Sep. 28, 2004

(54) ACTIVE REGION CORNER IMPLANTATION METHOD FOR FABRICATING A SEMICONDUCTOR INTEGRATED CIRCUIT MICROELECTRONIC FABRICATION

(75) Inventors: Feng-Cheng Yang, Tainan County (TW); Chung-Te Lin, Tainan (TW); Yea-Dean Sheu, Tainan (TW); Chih-Hung Wang, Jhonghe (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/641,445

(22) Filed: Aug. 13, 2003

(51) Int. Cl.[7] ................................................ H01L 21/76
(52) U.S. Cl. ........................ 438/424; 438/425; 438/426; 438/221; 438/296; 438/297; 438/450
(58) Field of Search ................................ 438/196, 362, 438/400, 439, 448, 428, 450, 353, 359, 218–219, 221, 225, 294–297, 424–426, 262, 258–259

(56) References Cited

U.S. PATENT DOCUMENTS

| | | | |
|---|---|---|---|
| 6,156,620 A | | 12/2000 | Puchner et al. |
| 6,323,106 B1 | | 11/2001 | Huang et al. |
| 6,569,747 B1 | * | 5/2003 | Achuthan et al. ............ 438/424 |
| 2003/0022426 A1 | * | 1/2003 | Kumamoto ................. 438/197 |
| 2003/0042546 A1 | * | 3/2003 | Abbott ........................ 257/368 |
| 2004/0005764 A1 | * | 1/2004 | Wu et al. .................... 438/400 |

* cited by examiner

Primary Examiner—David A. Zarneke
Assistant Examiner—Thanh Y. Tran
(74) Attorney, Agent, or Firm—Tung & Associates

(57) ABSTRACT

Within a method for forming an isolation region within a semiconductor substrate, there is, prior to forming the isolation region within an isolation trench formed adjoining an active region of a semiconductor substrate, implanted a dopant into a corner of the active region. The corner of the active region is uncovered by laterally etching an isolation trench mask to form a laterally etched isolation trench mask which serves as an ion implantation mask layer when implanting the dopant into the corner of the active region. The method provides for enhanced performance, and minimal affect of a semiconductor device formed within the active region of the semiconductor substrate.

20 Claims, 3 Drawing Sheets

ACTIVE REGION CORNER IMPLANTATION METHOD FOR FABRICATING A SEMICONDUCTOR INTEGRATED CIRCUIT MICROELECTRONIC FABRICATION

BACKGROUND OF THE INVENTION

1. Field of the Invention

The present invention relates generally to methods for fabricating semiconductor integrated circuit microelectronic fabrications. More particularly, the present invention relates to methods for fabricating, with enhanced performance, semiconductor integrated circuit microelectronic fabrications.

2. Description of the Related Art

Semiconductor integrated circuit microelectronic fabrications are formed from semiconductor substrates within and upon which are formed semiconductor devices and over which are formed patterned conductor layers which are separated by dielectric layers.

Common in the art of semiconductor integrated circuit microelectronic fabrication is the fabrication and use of isolation regions which isolate semiconductor devices formed within adjacent active regions within a semiconductor substrate. While isolation regions are thus desirable in the art of semiconductor integrated circuit microelectronic fabrication and often essential in the art of semiconductor integrated circuit microelectronic fabrication, isolation regions are nonetheless not formed entirely without problems in the art of semiconductor integrated circuit microelectronic fabrication.

In that regard, as semiconductor integrated circuit microelectronic fabrication integration levels have increased and semiconductor device and isolation region dimensions have decreased, it has become increasingly more difficult to fabricate semiconductor integrated circuit microelectronic fabrications such that isolation region fabrication methods minimally affect semiconductor devices formed within adjacent active regions within a semiconductor substrate.

It is thus desirable in the art of semiconductor integrated circuit microelectronic fabrication to fabricate semiconductor integrated circuit microelectronic fabrications such that isolation region fabrication methods minimally affect semiconductor devices formed within adjacent active regions within a semiconductor substrate.

It is towards the foregoing object that the present invention is directed.

Various methods have been disclosed within the art of semiconductor integrated circuit microelectronic fabrication for forming, with desirable properties, isolation regions within semiconductor substrates.

Often, such methods may be directed towards materials considerations when forming isolation regions within semiconductor substrates. Representative among such methods, but not limiting among such methods, are methods disclosed within Puchner et al., in U.S. Pat. No. 6,156,620 and Huang et al., in U.S. Pat. No. 6,323,106, the disclosures of which are incorporated herein fully by reference.

Desirable in the art of semiconductor integrated circuit microelectronic fabrication are additional methods for forming within semiconductor substrates isolation regions such as to minimally affect semiconductor devices formed within adjacent active regions within the semiconductor substrates.

It is towards the foregoing object that the present invention is directed.

SUMMARY OF THE INVENTION

A first object of the present invention is to provide a method for forming an isolation region within a semiconductor substrate.

A second object of the present invention is to provide a method in accord with the first object of the present invention, wherein the isolation region is formed such as to minimally affect semiconductor devices formed within active regions adjacent the isolation region within the semiconductor substrate.

In accord with the objects of the present invention, there is provided by the present invention a method for forming an isolation region within a semiconductor integrated circuit microelectronic fabrication. To practice the method of the present invention, there is first provided a semiconductor substrate. There is then formed over the semiconductor substrate an isolation trench mask layer which defines the location of an isolation trench to be formed adjoining an active region of the semiconductor substrate. There is then etched the semiconductor substrate, while employing the isolation trench mask layer as an etch mask layer, to form the isolation trench adjoining the active region of the semiconductor substrate. There is then laterally etched the isolation trench mask layer to form a laterally etched isolation trench mask layer which uncovers a corner of the active region of the semiconductor substrate adjoining the isolation trench. There is then implanted into the corner of the active region, while employing the laterally etched isolation trench mask layer as an ion implantation mask layer, a dose of a dopant such as to provide a corner implanted active region. Finally, there is then formed into the isolation trench adjacent the corner implanted active region an isolation region.

The present invention provides a method for forming an isolation region within a semiconductor substrate, wherein the isolation region is formed while minimally affecting semiconductor devices formed within active regions adjacent the isolation region within the semiconductor substrate.

The present invention realizes the foregoing object by, prior to forming an isolation region within an isolation trench formed adjoining an active region of a semiconductor substrate, implanting a dopant into a corner of the active region uncovered by laterally etching an isolation trench mask to form a laterally etched isolation trench mask which serves as an ion implantation mask layer when implanting the dopant into the corner of the active region.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming an isolation region within a semiconductor substrate, wherein the isolation region is formed while minimally affecting semiconductor devices formed within active regions adjacent the isolation region within the semiconductor substrate.

The present invention realizes the foregoing object by, prior to forming an isolation region within an isolation trench formed adjoining an active region of a semiconductor substrate, implanting a dopant into a corner of the active region uncovered by laterally etching an isolation trench mask to form a laterally etched isolation trench mask which serves as an ion implantation mask layer when implanting the dopant into the corner of the active region.

While the preferred embodiment of the present invention illustrates the present invention most particularly within the context of forming an isolation region within an N semiconductor substrate such as to provide with enhanced performance a P metal oxide semiconductor field effect transistor (P-MOSFET) device formed within the N semiconductor substrate, the present invention is not intended to be so limited. Rather, the present invention may be employed for forming isolation regions within both N semiconductor substrates and P semiconductor substrates such as to provide enhanced performance of devices including but not limited to passive devices (i.e., resistors and capacitors) and active devices (i.e., transistors, diodes and related devices which include N channel devices and P channel devices).

Referring now to FIG. 1 to FIG. 6, there is shown a series of schematic cross-sectional diagrams illustrating the results of progressive stages of forming, in accord with a preferred embodiment of the present invention, a semiconductor integrated circuit microelectronic fabrication having formed therein an isolation region formed in accord with the present invention.

Figure 1:
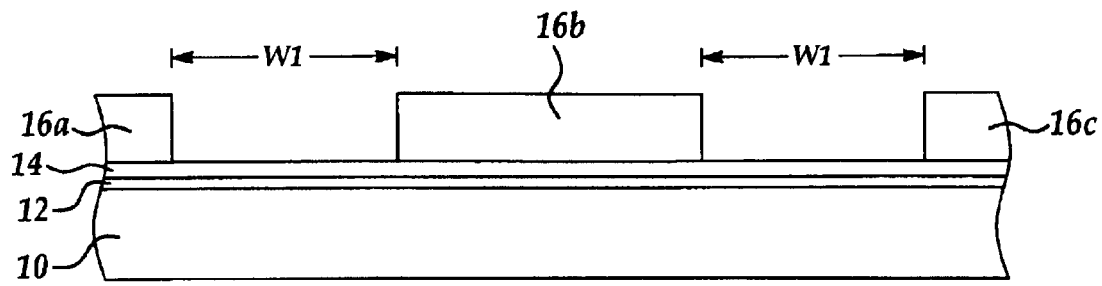
FIG. 1, FIG. 2, FIG. 3, FIG. 4a, FIG. 4b, FIG. 5 and FIG. 6 show a series of schematic cross-sectional diagrams illustrating the results of progressive stages of forming, in accord with a preferred embodiment of the present invention, a semiconductor integrated circuit microelectronic fabrication having formed therein an isolation region formed in accord with the present invention.

Shown in FIG. 1 is a schematic cross-sectional diagram of the semiconductor integrated circuit microelectronic fabrication at an early stage in its fabrication in accord with the preferred embodiment of the present invention.

Shown in FIG. 1 is a semiconductor substrate 10 having formed thereupon a blanket pad oxide layer 12 in turn having formed thereupon a blanket silicon nitride containing layer 14 in turn having formed thereupon a series of patterned photoresist layers 16a, 16b and 16c.

Within the preferred embodiment of the present invention, the semiconductor substrate 10 is typically and preferably either an N-semiconductor substrate or a P-semiconductor substrate having formed therein a doped well region which provides a doped surface to the semiconductor substrate 10. Within the present invention, the semiconductor substrate 10 may be formed of semiconductor materials including but not limited to silicon semiconductor materials, germanium semiconductor materials and silicon-germanium alloy semiconductor materials. In addition, within the preferred embodiment of the present invention the blanket pad oxide layer 12 is typically and preferably formed incident to thermal oxidation of a silicon semiconductor substrate at a temperature of from about 0 to about 15 degrees centigrade to form the blanket pad oxide layer 12 of silicon oxide of thickness from about 10 to about 130 angstroms. Further, within the preferred embodiment of the present invention, the blanket silicon nitride containing layer 14 may be formed of silicon nitrides, silicon oxynitrides and composites thereof, typically and preferably formed to a thickness of from about 1000 to about 2000 angstroms. Finally, within the preferred embodiment of the present invention each of the series of patterned photoresist layers 16a, 16b and 16c is typically and preferably formed to a thickness of from about 3000 to about 5500 angstroms, from either a positive photoresist maternal or a negative photoresist material, to define the locations of a pair of isolation trenches to be etched within the semiconductor substrate 10. Typically and preferably, adjacent patterned photoresist layers 16a and 16b, or 16b and 16c, are separated by a distance of from about 0.1 to about 12 microns, which corresponds with the areal dimensions of the pair of isolation trenches desired to be formed within the semiconductor substrate 10.

Figure 2:
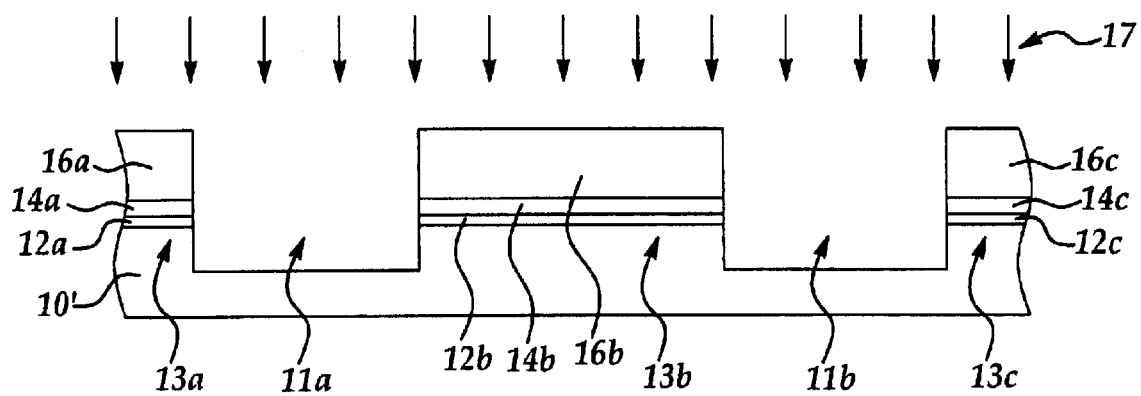

Referring to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein there has been sequentially etched, while employing an etching plasma 17: (1) the blanket silicon nitride containing layer 14 to form a pair of patterned silicon nitride containing layers 14a, 14b and 14c (which serve within the present invention as an isolation trench mask layer) while employing the series of patterned photoresist layers 16a, 16b and 16c as a first etch mask layer; (2) the blanket pad oxide layer 12 to form a series of patterned pad oxide layers 12a, 12b and 12c while employing the series of patterned photoresist layers 16a, 16b and 16c and the series of patterned silicon nitride containing layers 14a, 14b and 14c as a second etch mask layer; and (3) the semiconductor substrate 10 to form a partially etched semiconductor substrate 10' having defined therein a pair of isolation trenches 11a and 11b which separate a series of active regions 13a, 13b and 13c, while employing the series of patterned photoresist layers 16a, 16b and 16c, the series of patterned silicon nitride containing layers 14a, 14b and 14c and the series of patterned pad oxide layers 12a, 12b and 12c as a third etch mask layer.

Within the preferred embodiment of the present invention, the etching plasma 17 typically and preferably employs: (1) a fluorine containing etchant gas composition for etching: (a) the blanket silicon nitride containing layer 14 when forming therefrom the series of patterned silicon nitride containing layers 14a, 14b and 14c; and (b) the blanket pad oxide layer 12 when forming therefrom the series of patterned pad oxide layers 12a, 12b and 12c; and (2) a chlorine containing etchant gas composition when forming the pair of isolation trenches 11a and 11b within the partially etched semiconductor substrate 10'.

Figure 3:
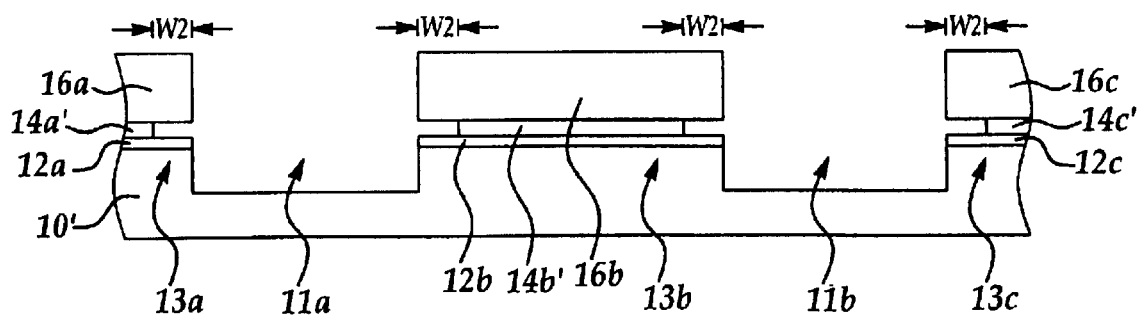

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein the series of patterned silicon nitride containing layers 14a, 14b and 14c (which serves as the isolation trench mask layer within the context of the present invention), has been laterally etched to form therefrom a series of laterally etched patterned silicon nitride containing layers 14a', 14b' and 14c' (which serves as a laterally etched trench mask layer within the context of the present invention).

Within the preferred embodiment of the present invention, the lateral etching of the series of patterned silicon nitride containing layers 14a, 14b and 14c, to form the series of laterally etched patterned silicon nitride containing layers 14a', 14b' and 14c' may be undertaken while employing an isotropic wet chemical etchant as is otherwise conventional in the art of semiconductor integrated circuit microelectronic fabrication. In particular an aqueous phosphoric acid isotropic wet chemical etchant at elevated temperature is appropriate within the context of the present invention. Typically and preferably, each of the series of patterned silicon nitride containing layers 14a, 14b and 14c is laterally etched to provide a series of recesses of linewidth W2 from about 100 to about 300 angstroms undercutting the sidewalls of each of the patterned photoresist layers 16a, 16b and 16c.

Figure 4A:
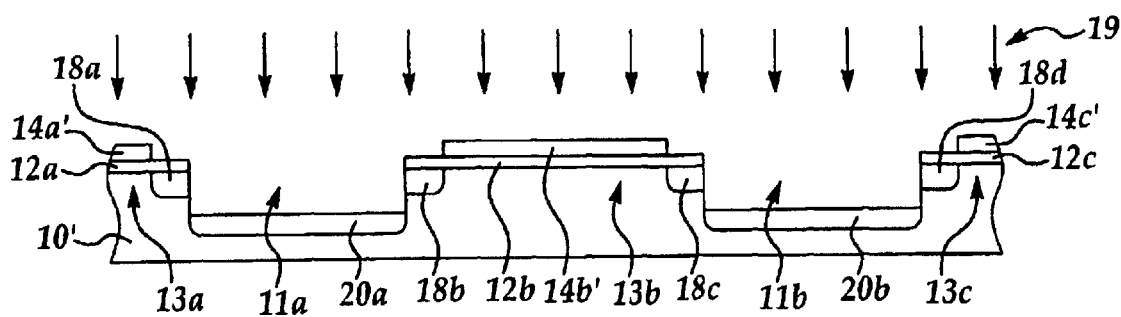

Referring now to FIG. 4a, there is shown a schematic cross-sectional diagram illustrating the results of further processing of the semiconductor integrated circuit microelectronic fabrication whose schematic cross-sectional diagram is illustrated in FIG. 3.

Shown in FIG. 4a is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein, in a first instance, the series of patterned photoresist layers 16a, 16b and 16c has been stripped from the series of laterally etched patterned silicon nitride containing layers 14a', 14b' and 14c'.

Within the preferred embodiment of the present invention, the series of patterned photoresist layers 16a, 16b and 16c may be stripped from the series of laterally etched patterned silicon nitride containing layers 14a', 14b' and 14c' while employing photoresist stripping methods as are otherwise conventional or unconventional in the art of semiconductor integrated circuit microelectronic fabrication.

Also shown within the schematic cross-sectional diagram of FIG. 4a is the results of ion implanting the partially etched semiconductor substrate 10', while employing the series of laterally etched patterned silicon nitride containing layers 14a', 14b' and 14c' as an ion implantation mask, and in conjunction with a dose of implanting dopant ions 19, to form: (1) a series of corner implant regions 18a, 18b, 18c and 18d within the series of active regions 13a, 13b and 13c within the partially etched semiconductor substrate 10'; and (2) a pair of isolation trench floor implant regions 20a and 20b at the bottoms of the pair of isolation trenches 11a and 11b within the partially etched semiconductor substrate 10'.

Within the preferred embodiment of the present invention, the dose of implanting dopant ions 19 is provided of polarity opposite the polarity of the partially etched semiconductor substrate 10', preferably P dopant ions, and at an ion implantation dose of from about $10^{12}$ to about $10^{13}$ dopant ions per square centimeter and an ion implantation energy of from about 100 to about 150 keV to provide the corner implant regions 18a, 18b, 18c and 18d of linewidth from about 100 to about 250 angstroms within the series of active regions 13a, 13b and 13c and depth from about 300 to about 700 angstroms within the series of active regions 13a, 13b and 13c.

As is understood by a person skilled in the art, and under circumstances where the dose of dopant ions 19 is not provided orthogonally with respect to the partially etched semiconductor substrate 10' and/or the depth of the pair of isolation trenches is not sufficiently deep, it may be desirable to form within each of the isolation trenches 11a and 11b a patterned photoresist layer such as to preclude at least part of the formation of the pair of isolation trench floor implant regions 20a and 20b which might otherwise cause for electrical shorting amongst the series of corner implant regions 18a, 18b, 18c and 18d. Such a patterned photoresist layer may be regarded as an isolation trench fill mask layer.

Figure 4B:
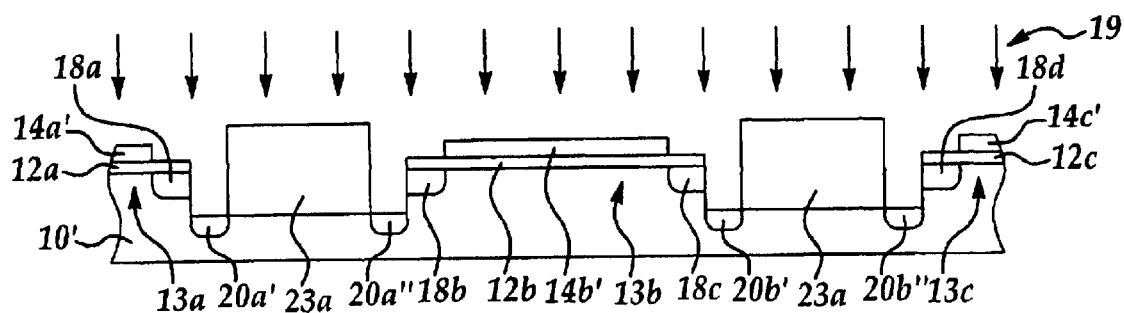

A schematic cross-sectional diagram of such a semiconductor integrated circuit microelectronic fabrication is illustrated in FIG. 4b, which corresponds generally with the semiconductor integrated circuit microelectronic fabrication of FIG. 4a, but wherein there is formed into the pair of isolation trenches 11a and 11b a pair of patterned second photoresist layers 23a and 23b which in turn provide for formation of the series of separated isolation trench floor implant regions 20a', 20a", 20b' and 20b", rather than the pair of isolation trench floor implant regions 20a and 20b as illustrated within FIG. 4a.

Figure 5:
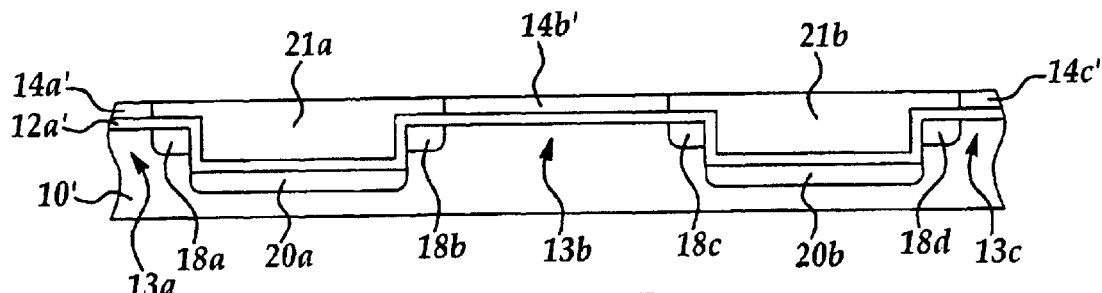

Referring now to FIG. 5, there is shown a schematic cross-sectional diagram illustrating the results of further processing of the semiconductor integrated circuit microelectronic fabrication whose schematic cross-sectional diagram is illustrated in FIG. 4a. Although not specifically illustrated, analogous further processing may also be effected for the semiconductor integrated circuit microelectronic fabrication whose schematic cross-sectional diagram is illustrated in FIG. 4b.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4a, but wherein, in a first instance, there is formed into each of the isolation trenches 11a and 11b a contiguous blanket pad oxide and trench liner layer 12' (which incorporates the series of patterned pad oxide layers 12a, 12b and 12c) which is typically formed incident to thermal oxidation of the partially etched semiconductor substrate 10', although other methods may also be employed. The contiguous blanket pad oxide and trench liner layer 12' is typically and preferably formed to a thickness of from about 10 to about 150 angstroms.

In addition, there is also shown within the schematic cross-sectional diagram of FIG. 5 formed into the pair of isolation tenches 11a and 11b having formed therein the contiguous blanket pad oxide and trench liner layer 12' a pair of isolation regions 21a and 21b.

Within the preferred embodiment of the present invention, the pair of isolation regions 21a and 21b is typically and preferably formed employing a blanket silicon oxide containing layer deposition and chemical mechanical polish (CMP) planarizing method as is otherwise generally conventional in the art of semiconductor integrated circuit microelectronic fabrication, although other methods and materials may also be employed.

Figure 6:
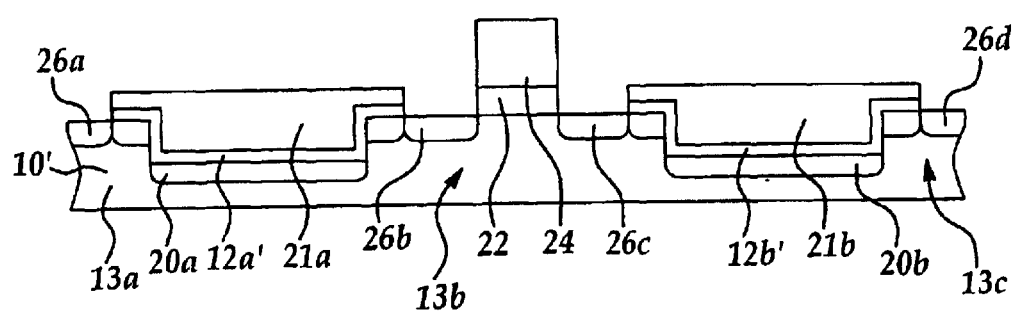

Referring now to FIG. 6, there is shown a schematic cross-sectional diagram illustrating the results of further processing of the semiconductor integrated circuit microelectronic fabrication whose schematic cross-sectional diagram is illustrated in FIG. 5.

Shown in FIG. 6 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5, but wherein, in a first instance, there is stripped from the contiguous blanket pad oxide and trench liner layer 12' the series of laterally etched patterned silicon nitride containing layers 14a', 14b' and 14c'.

The series of laterally etched patterned silicon nitride containing layers 14a', 14b' and 14c', may be stripped from the contiguous blanket pad oxide and trench liner layer 12' while employing stripping methods and materials as are otherwise generally conventional in the art of semiconductor integrated circuit microelectronic fabrication.

In addition, there is also illustrated within the schematic cross-sectional diagram of FIG. 6 the results of patterning the contiguous blanket pad oxide and trench liner layer 12' to form a pair of trench liner layers 12a' and 12b'. Such patterning may also be effected while employing methods and materials as are generally conventional in the art of semiconductor integrated circuit microelectronic fabrication.

Finally, there is also shown within the schematic cross-sectional diagram of FIG. 6, and formed within and upon the active region 13b of the partially etched semiconductor substrate 10' a field effect transistor (FET) device comprising: (1) a gate dielectric layer 22 formed upon the active region 13b of the partially etched semiconductor substrate 10'; (2) a gate electrode 24 aligned upon the gate dielectric layer 22; and (3) a pair of source/drain regions 26b and 26c formed into the active region 13b of the partially etched semiconductor substrate 10' at areas not covered by the gate dielectric layer 22 and the gate electrode 24, where the pair of source/drain regions 26a and 26b is of the same polarity as, and incorporate, the pair of corner implant regions 18b and 18c. Similarly, there is also illustrated within the schematic cross-sectional diagram of FIG. 6 an additional pair of source/drain regions 26a and 26b within the active regions 13a and 13c of the partially etched semiconductor substrate 10', which incorporate the corresponding pair of corner implant regions 18a and 18d.

Within the preferred embodiment of the present invention, the gate dielectric layer 22, the gate electrode 24 and the series of source/drain regions 26a, 26b and 26c may be formed employing methods and materials as are otherwise generally conventional in the art of semiconductor integrated circuit microelectronic fabrication. Typically and preferably, the gate dielectric layer 22 is formed to a thickness of from about 15 to about 26 angstroms from a silicon oxide gate dielectric material. Typically and preferably, the gate electrode is formed from a doped polysilicon greater than about 1E19 dopant atoms per cubic centimeter or polycide (doped polysilicon/metal silicide stack) gate electrode material formed to a thickness of from about 1500 to about 2500 angstroms. Typically and preferably, the series of source/drain regions 26a, 26b and 26c is formed incident to ion implantation at an ion implantation dose of from about $10^{12}$ to about $10^{13}$ dopant ions per square centimeter and an ion implantation energy of from about 100 to about 150 keV.

Upon forming the semiconductor integrated circuit microelectronic fabrication whose schematic cross-sectional diagram is illustrated in FIG. 6, there is formed within the semiconductor integrated circuit microelectronic fabrication in accord with the preferred embodiment of the present invention an isolation region which is formed while minimally affecting a semiconductor device formed within an active region adjacent the isolation region within the semiconductor substrate.

The present invention realizes the foregoing object by, prior to forming the isolation region within an isolation trench formed adjoining the active region of a semiconductor substrate, implanting a dopant into a corner of the active region uncovered by laterally etching an isolation trench mask to form a laterally etched isolation trench mask which serves as an ion implantation mask layer when implanting the dopant into the corner of the active region.

EXAMPLES

In order to illustrate the value of the present invention, there was prepared several series of semiconductor integrated circuit microelectronic fabrications having formed therein isolation regions adjacent active regions having formed therein field effect transistor (FET) devices both in accord with the present invention (i.e., having corner implant regions within the active regions) and not in accord with the present invention (i.e., not having corner implant regions within the active regions).

Figure 7:
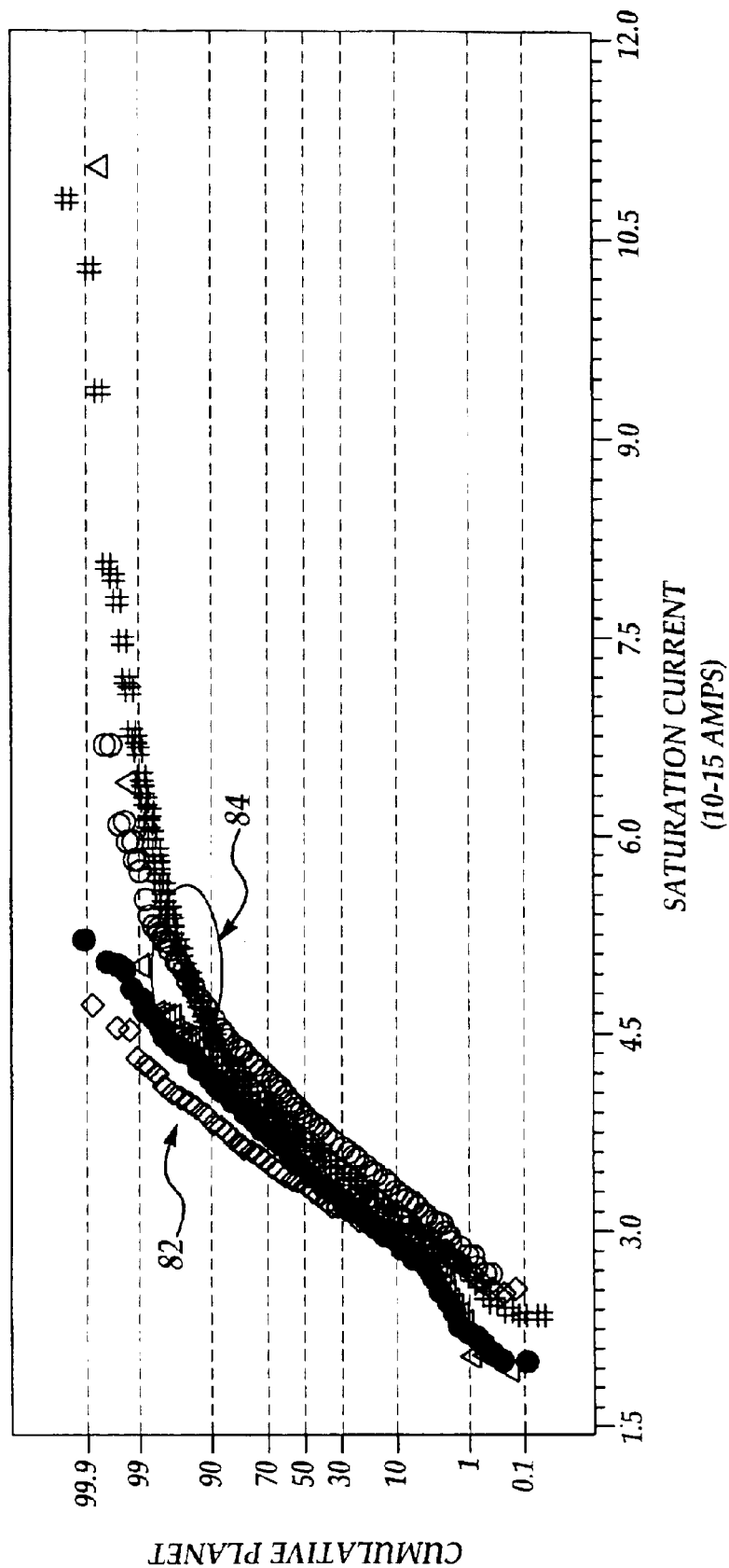
FIG. 7 shows a graph of Cummulative Percent versus Saturation Current for several series of field effect transistors devices formed within corresponding series of semiconductor integrated circuit microelectronic fabrications formed in accord and not in accord with the present invention.

There was then measured for the series of field effect transistor devices saturation currents, the results of which are reported in the graph of FIG. 7.

Within FIG. 7, the group of curves which correspond with reference numeral 84 correspond with saturation currents for the series of field effect transistor (FET) devices formed within active regions absent corner implant regions, while the curve which corresponds with reference numeral 82 corresponds with field effect transistor (FET) devices formed within active regions having corner implant regions in accord with the present invention.

As is illustrated within the graph of FIG. 7, the curve which corresponds with reference numeral 82 shows attenuated tailing at higher saturation current, which corresponds with enhanced performance of the series of field effect transistor (FET) devices.

As is understood by a person skilled in the art, the preferred embodiment and examples of the present invention are illustrative of the present invention rather than limiting of the present invention. Revisions and modifications may be made to methods, materials, structures and dimensions employed for forming a semiconductor integrated circuit microelectronic fabrication in accord with the preferred embodiment and examples of the present invention while still providing a method in accord with the present, further in accord with the appended claims.

What is claimed is:

1. A method for forming an isolation region comprising:
   providing a semiconductor substrate;
   forming over the semiconductor substrate an isolation trench mask layer which defines the location of an isolation trench to be formed adjoining an active region of the semiconductor substrate;
   etching the semiconductor substrate, while employing the isolation trench mask layer as an etch mask layer, to form the isolation trench adjoining the active region of the semiconductor substrate;
   laterally etching the isolation trench mask layer to form a laterally etched isolation trench mask layer which uncovers a corner of the active region of the semiconductor substrate adjoining the isolation trench;
   implanting into the corner of the active region, while employing the laterally etched isolation trench mask layer as an ion implantation mask layer, a dose of a dopant such as to provide a corner implanted active region; and forming into the isolation trench adjacent the corner implanted active region an isolation region.

2. The method of claim 1 wherein the semiconductor substrate is formed from a semiconductor material selected from the group consisting of silicon semiconductor materials, germanium semiconductor materials and silicon-germanium alloy semiconductor materials.

3. The method of claim 1 wherein the isolation trench mask layer is laterally etched by a lateral distance of from about 3500 to about 4500 angstroms when forming therefrom the laterally etched isolation trench mask layer.

4. The method of claim 1 wherein the corner of the active region is implanted to a width of from about 100 to about 300 angstroms and a depth of from about 300 to about 700 angstroms within the active region.

5. The method of claim 1 wherein the corner of the active region is implanted with a dopant of polarity opposite the semiconductor substrate.

6. A method for forming a semiconductor integrated circuit microelectronic fabrication comprising:

providing a semiconductor substrate;

forming over the semiconductor substrate an isolation trench mask layer which defines the location of an isolation trench to be formed adjoining an active region of the semiconductor substrate;

etching the semiconductor substrate, while employing the isolation trench mask layer as an etch mask layer, to form the isolation trench adjoining the active region of the semiconductor substrate;

laterally etching the isolation trench mask layer to form a laterally etched isolation trench mask layer which uncovers a corner of the active region of the semiconductor substrate adjoining the isolation trench;

implanting into the corner of the active region, while employing the laterally etched isolation trench mask layer as an ion implantation mask layer, a dose of a dopant such as to provide a corner implanted active region;

forming into the isolation trench adjacent the corner implanted active region an isolation region; and forming within the corner implanted active region a semiconductor device.

7. The method of claim 6 wherein by implanting the dopant into the corner of the active region, the semiconductor device is formed with enhanced performance.

8. The method of claim 6 wherein the semiconductor substrate is formed from a semiconductor material selected from the group consisting of silicon semiconductor materials, germanium semiconductor materials and silicon-germanium alloy semiconductor materials.

9. The method of claim 6 wherein the isolation trench mask layer is laterally etched by a lateral distance of from about 3500 to about 4500 angstroms when forming therefrom the laterally etched isolation trench mask layer.

10. The method of claim 6 wherein the corner of the active region is implanted to a width of from about 100 to about 300 angstroms and a depth of from about 300 to about 700 angstroms within the active region.

11. The method of claim 6 wherein the corner of the active region is implanted with a dopant of polarity opposite the semiconductor substrate.

12. The method of claim 6 wherein the semiconductor device is selected from the group consisting of active devices and passive devices.

13. A method for forming an isolation region comprising:

providing a semiconductor substrate;

forming over the semiconductor substrate an isolation trench mask layer which defines the location of an isolation trench to be formed adjoining an active region of the semiconductor substrate;

etching the semiconductor substrate, while employing the isolation trench mask layer as an etch mask layer, to form the isolation trench adjoining the active region of the semiconductor substrate;

laterally etching the isolation trench mask layer to form a laterally etched isolation trench mask layer which uncovers a corner of the active region of the semiconductor substrate adjoining the isolation trench;

forming an isolation trench filler mask layer contained within the isolation trench;

implanting into the corner of the active region, while employing the laterally etched isolation trench mask layer and the isolation trench filler mask layer as a pair of ion implantation mask layers, a dose of a dopant such as to provide a corner implanted active region;

stripping the isolation trench filler mask layer from the isolation trench; and forming into the isolation trench adjacent the corner implanted active region an isolation region.

14. The method of claim 13 wherein the semiconductor substrate is formed from a semiconductor material selected from the group consisting of silicon semiconductor materials, germanium semiconductor materials and silicon-germanium alloy semiconductor materials.

15. The method of claim 13 wherein the isolation trench mask layer is laterally etched by a lateral distance of from about 3500 to about 4500 angstroms when forming therefrom the laterally etched isolation trench mask layer.

16. The method of claim 13 wherein the corner of the active region is implanted to a width of from about 100 to about 300 angstroms and a depth of from about 300 to about 700 angstroms within the active region.

17. The method of claim 13 wherein the corner of the active region is implanted with a dopant of polarity opposite the semiconductor substrate.

18. The method of claim 13 further comprising forming into the corner implanted active region a semiconductor device.

19. The method of claim 18 wherein the semiconductor device is selected from the group consisting of active devices and passive device.

20. The method of claim 18 wherein the semiconductor device is a field effect transistor device.

* * * * *